US007879698B2

(12) United States Patent
Ye

(10) Patent No.: US 7,879,698 B2
(45) Date of Patent: Feb. 1, 2011

(54) INTEGRATED PROCESS SYSTEM AND PROCESS SEQUENCE FOR PRODUCTION OF THIN FILM TRANSISTOR ARRAYS USING DOPED OR COMPOUNDED METAL OXIDE SEMICONDUCTOR

(75) Inventor: Yan Ye, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 12/405,941

(22) Filed: Mar. 17, 2009

(65) Prior Publication Data

US 2009/0239359 A1 Sep. 24, 2009

Related U.S. Application Data

(60) Provisional application No. 61/038,999, filed on Mar. 24, 2008.

(51) Int. Cl.
H01L 21/20 (2006.01)
(52) U.S. Cl. .................. 438/479; 257/E21.09
(58) Field of Classification Search .......... 438/479, 438/478; 252/519.5, 520.1, 520.2
See application file for complete search history.

(56) References Cited

U.S. PATENT DOCUMENTS

| 4,436,770 A | 3/1984 | Nishizawa et al. |
| 4,769,291 A | 9/1988 | Belkind et al. |
| 4,816,082 A | 3/1989 | Guha et al. |
| 4,983,360 A | 1/1991 | Merdrignac et al. |
| 5,279,679 A | 1/1994 | Murakami et al. |
| 5,346,601 A | 9/1994 | Barada et al. |
| 5,352,300 A | 10/1994 | Niwa et al. |
| 5,420,452 A | 5/1995 | Tran et al. |
| 5,522,934 A | 6/1996 | Suzuki et al. |
| 5,571,749 A | 11/1996 | Matsuda et al. |
| 5,620,523 A | 4/1997 | Maeda et al. |

(Continued)

FOREIGN PATENT DOCUMENTS

EP 145403 A2 6/1985

(Continued)

OTHER PUBLICATIONS

Toyoura et al., "Optical properties of zinc nitride formed by molten salt electrochemical process", Thin Film Solids 492 (2005), pp. 88-92.

(Continued)

Primary Examiner—Charles D Garber
Assistant Examiner—Reema Patel
(74) Attorney, Agent, or Firm—Patterson & Sheridan, LLP

(57) ABSTRACT

The present invention generally relates to an integrated processing system and process sequence that may be used for thin film transistor (TFT) fabrication. In fabricating TFTs, numerous processes may be performed on a substrate to ultimately produce the desired TFT. These processes may be performed in numerous processing chambers that may be coupled to a common transfer chamber. The arrangement of the processing chambers and the sequence in which the substrate may pass through the processing chambers may affect the device performance. By placing specific processing chambers around a common transfer chamber, multiple processes may be performed without undue exposure of the TFT to atmosphere. Alternatively, by passing the substrate sequentially through specific processing chambers, multiple processes may be performed without undue exposure of the TFT to atmosphere.

20 Claims, 5 Drawing Sheets

U.S. PATENT DOCUMENTS

| | | | |
|---|---|---|---|
| 5,668,663 | A | 9/1997 | Varaprasad et al. |
| 5,683,537 | A | 11/1997 | Ishii |
| 5,700,699 | A | 12/1997 | Han et al. |
| 5,716,480 | A | 2/1998 | Matsuyama et al. |
| 5,720,826 | A | 2/1998 | Hayashi et al. |
| 5,993,594 | A | 11/1999 | Wicker et al. |
| 6,150,668 | A | 11/2000 | Bao et al. |
| 6,153,013 | A | 11/2000 | Sakai et al. |
| 6,159,763 | A | 12/2000 | Sakai et al. |
| 6,180,870 | B1 | 1/2001 | Sano et al. |
| 6,228,236 | B1 | 5/2001 | Rosenstein et al. |
| 6,238,527 | B1 | 5/2001 | Sone et al. |
| 6,329,269 | B1 | 12/2001 | Hamada et al. |
| 6,388,301 | B1 | 5/2002 | Tawada et al. |
| 6,458,673 | B1 | 10/2002 | Cheung |
| 6,488,824 | B1 | 12/2002 | Hollars et al. |
| 6,566,180 | B2 | 5/2003 | Park et al. |
| 6,620,719 | B1 | 9/2003 | Andry et al. |
| 6,700,057 | B2 | 3/2004 | Yasuno |
| 6,787,010 | B2 | 9/2004 | Cuomo et al. |
| 6,825,134 | B2 | 11/2004 | Law et al. |
| 6,881,305 | B2 | 4/2005 | Black et al. |
| 6,943,359 | B2 | 9/2005 | Vardeny et al. |
| 6,953,947 | B2 | 10/2005 | Son et al. |
| 7,026,713 | B2 | 4/2006 | Hoffman et al. |
| 7,037,157 | B2 | 5/2006 | Murakami et al. |
| 7,145,174 | B2 | 12/2006 | Chiang et al. |
| 7,158,208 | B2 | 1/2007 | De Jager et al. |
| 7,189,992 | B2 | 3/2007 | Wager, III et al. |
| 7,235,810 | B1 | 6/2007 | Yamazaki et al. |
| 7,339,187 | B2 | 3/2008 | Wager, III et al. |
| 7,382,421 | B2 | 6/2008 | Hoffman et al. |
| 7,626,201 | B2 | 12/2009 | Chiang et al. |
| 7,629,191 | B2 | 12/2009 | Chiang et al. |
| 2003/0015234 | A1 | 1/2003 | Yasuno |
| 2003/0049464 | A1 | 3/2003 | Glenn et al. |
| 2003/0207093 | A1 | 11/2003 | Tsuji et al. |
| 2003/0218222 | A1* | 11/2003 | Wager et al. ............... 257/410 |
| 2004/0018797 | A1 | 1/2004 | Murakami et al. |
| 2004/0113098 | A1 | 6/2004 | Vardeny et al. |
| 2004/0164294 | A1 | 8/2004 | Son et al. |
| 2004/0175511 | A1 | 9/2004 | Hartig |
| 2005/0017244 | A1 | 1/2005 | Hoffman et al. |
| 2005/0028860 | A1 | 2/2005 | Sano et al. |
| 2005/0062057 | A1 | 3/2005 | Yamazaki et al. |
| 2005/0062409 | A1 | 3/2005 | Yamazaki et al. |
| 2005/0067953 | A1 | 3/2005 | Yamazaki et al. |
| 2005/0181532 | A1 | 8/2005 | Patel et al. |
| 2005/0233092 | A1 | 10/2005 | Choi et al. |
| 2005/0233595 | A1 | 10/2005 | Choi et al. |
| 2005/0251990 | A1 | 11/2005 | Choi et al. |
| 2006/0011139 | A1 | 1/2006 | Sterling et al. |
| 2006/0038182 | A1 | 2/2006 | Rogers et al. |
| 2006/0043447 | A1 | 3/2006 | Ishii et al. |
| 2006/0046476 | A1 | 3/2006 | Nakamura et al. |
| 2006/0065299 | A1 | 3/2006 | Fukawa et al. |
| 2006/0125098 | A1 | 6/2006 | Hoffman et al. |
| 2006/0244107 | A1* | 11/2006 | Sugihara et al. ............ 257/646 |
| 2007/0007125 | A1 | 1/2007 | Krasnov et al. |
| 2007/0017445 | A1 | 1/2007 | Takehara et al. |
| 2007/0020903 | A1* | 1/2007 | Takehara et al. ............ 438/592 |
| 2007/0030569 | A1 | 2/2007 | Lu et al. |
| 2007/0065962 | A1 | 3/2007 | Pichler |
| 2007/0068571 | A1 | 3/2007 | Li et al. |
| 2007/0131536 | A1* | 6/2007 | Hartig et al. ............ 204/192.1 |
| 2007/0141784 | A1 | 6/2007 | Wager et al. |
| 2007/0197379 | A1 | 8/2007 | Miura |
| 2008/0108198 | A1 | 5/2008 | Wager et al. |
| 2009/0026065 | A1 | 1/2009 | Nukeaw et al. |

FOREIGN PATENT DOCUMENTS

| | | |
|---|---|---|
| JP | 09-129698 A | 5/1997 |
| JP | 2007-150156 A | 6/2007 |
| KR | 1999009046 | 3/1999 |
| KR | 2001051193 | 6/2001 |

OTHER PUBLICATIONS

Ma et al., "Method of control of nitrogen content in ZnO films: Structural and photoluminescence properties", J. Vac. Sci. Technol. B 22(1), Jan./Feb. 2004, pp. 94-98.

Fortunato et al., "Wide-bandgap high-mobility ZnO thin-film transistors produced at room temperature", Applied Physics Letters, vol. 85, No. 13, Sep. 27, 2004, pp. 2541-2543.

Hoffman et al., "ZnO-based transparent thin-film transistors", Applied Physics Letters, vol. 82, No. 5, Feb. 3, 2003, pp. 733-735.

Zong et al., "Optical band gap of zinc nitride films prepared on quartz substrates from a zinc nitride target by reactive rf magnetron sputtering", Applied Surface Science 252 (2006), pp. 7983-7986.

Bian et al., "Deposition and electrical properties of N-In codoped p-type ZnO films by ultrasonic spray pyrolysis", Applied Physics Letters, vol. 84, No. 4, Jan. 26, 2004, pp. 541-543.

Barnes et al., "On the formation and stability of p-type conductivity in nitrogen-doped zinc oxide", Applied Physics Letters, 86, 112112 (2005).

Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.

Hosano et al., "Working hypothesis to explore novel wide band gap electrically conducting amorphous oxides and examples", Journal of Non-Crystalline Solids, 198-200 (1996) pp. 165-169.

Park et al., "Highly Stable $Ga_2O_3$-$In_2O_3$-ZnO Thin-Film Transistors for AM-OLED Application", IDW '07, pp. 1775-1778.

Kwon et al., "4 inch QVGA AMOLED display driven by GaInZnO TFT", IDW '07, pp. 1783-1786.

Perkins et al., "Identification of nitrogen chemical states in N-doped ZnO via x-ray photoelectron spectroscopy", Journal of Applied Physics 97, 034907 (2005).

Yao et al., "Effects of nitrogen doping and illumination on lattice constants and conductivity behavior of zinc oxide grown by magnetron sputtering", Journal of Applied Physics 99, 123510 (2006).

Tu et al., "Nitrogen-doped p-type ZnO films prepared from nitrogen gas radio-frequency magnetron sputtering", Journal of Applied Physics 100, 053705 (2006).

Klaitabtim et al., "Growth and Characterization of Zinc on/nitride Thin Films by Reactive Gas-Timing RF Magnetron Sputtering", Japanese Journal of Applied Physics, vol. 47, No. 1, 2008, pp. 653-656.

Lee et al., "42.2: World's Largest (15-inch) XGA AMLCD Panel Using IGZO Oxide TFT", SID 08 Digest, pp. 625-628.

Zong et al., "Structural properties of zinc nitride empty balls", Materials Letters 60 (2006), pp. 905-908.

Nomura et al., "Room-temperature fabrication of transparent flexible thin-film transistors using amorphous oxide semiconductors", Nature, vol. 432, Nov. 25, 2004, pp. 788-492.

Minami, Tadatsugu, "New n-Type Transparent Conducting Oxides", MRS Bulletin, Aug. 2000.

Zong et al., "Synthesis and thermal stability of $Zn_3N_2$ powder", Solid State Communications 132 (2004), pp. 521-525.

Kaminska et al., "Transparent p-type ZnO films obtained by oxidation of sputter-deposited $Zn_3N_2$", Solid State Communications, 135 (2005), pp. 11-15.

Son et al., "42.4L: Late-News Paper: 4 inch QVGA AMOLED Driven by the Threshold Voltage Controlled Amorphous GIZO ($Ga_2O_3$-$In_2O_3$-ZnO) TFT", SID 08 Digest, pp. 633-636.

Futushara et al., "Optical properties of zinc oxynitride thin films", Thin Film Solids, 317 (1998), pp. 322-325.

Futushara et al., "Structural, electrical and optical properties of zinc nitride thin films prepared by reactive rf magnetron sputtering", Thin Film Solids, 322 (1998), pp. 274-281.

Carcia et al., "Transparent ZnO thin-film transistor fabricated by rf magnetron sputtering", Applied Physics Letters, Col. 82, No. 7, Feb. 17, 2003, pp. 1117-1119.

Yan et al., "Control of Doping by Impurity Chemical Potentials: Predictions for p-type ZnO", Physical Review Letters, vol. 86, No. 25, Jun. 18, 2001, pp. 5723-5726.

Ohya et al., "Thin Film Transistor of ZnO Fabricated by Chemical Solution Deposition", Jpn. J. Appl. Phys., vol. 40 (2001), pp. 297-298.

Hossain, et al., "Modeling and simulation of polycrystalline ZnO thin-film transistors", Journal of Applied Physics, vol. 94, No. 12, Dec. 15, 2003, pp. 7768-7777.

Park et al., "Challenge to Future Displays: Transparent AM-OLED driven by PEALD grown ZnO TFT", IMID '07 Digest, pp. 1249-1252.

Hirao et al., "Bottom-Gate Zinc Oxide Thin-Film Transistors (ZnO TFTs) for AM-LCDs", IEEE Transactions on Electron Devices, Col. 55, No. 11, Nov. 2008, pp. 3136-3142.

Search report and written opinion for PCT/US2009/037520 (APPM/13078PCT) mailed Sep. 29, 2009.

Ozgur, et al. "A comprehensive review of ZnO materials and devices," Journal of Applied Physics 98, 041301 (2005), American Institute of Physics.

Wang, et al. "Epitaxial growth of NH3-doped ZnO thin films on <0224> oriented sapphire substrates," Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

Korean Office Action dated Jul. 21, 2008 for Korean Application No. 10-2007-0066962.

Hiramatsu, et al. "Formation of TiN films with low CI concentration by pulsed plasma chemical vapor deposition," American Vacuum Society, vol. 14, No. 3, May/Jun. 1996, pp. 1037-1040.

Zong et al., "Optical band gap of zinc nitride films prepared on quartz substrates from a zinc nitride target by reactive if magnetron sputtering", Applied Surface Science 252 (2006), pp. 7983-7986.

Tu et al., "Nitrogen-doped p-type ZnO films prepared from nitrogen gas radio-frequency magnetron sputtering", Journal of Applied Physics 100, 053705 (2006).

Futushara et al., "Optical properties of zinc oxynitride thin films", Thin Film Solids, 317 (1998), pp. 322-325.

Son et al., "Threshold Voltage Control of Amorphous Gallium Indium Zinc Oxide TFTs by Suppressing Back-Channel Current" Electrochemical and Solid-State Letters, 12 (1) H26-H28 (2009).

Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.

Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.

Li et al. "Progress in semiconducting oxide-based thin-film transistors for displays," Institute of Physics, Semicon. Sci. Technol. 20 (2005), pp. 720-725.

Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.

International Search Report and Written Opinion dated Aug. 8, 2008 for International Application No. PCT/US08/59638.

International Search Report and Written Opinion dated Oct. 8, 2008 for International Application No. PCT/US08/71890.

International Search Report and Written Opinion dated Oct. 15, 2007 for International Application No. PCT/US07/66166.

Freeman et al., "Chemical and Thin-Film Strategies for New Transparent Conducting Oxides", MRS Bulletin, Aug. 2000, p. 45-51.

Jin et al., "Optical properties of transparent and heat reflecting ZnO:Al films made by reactive sputtering", Appl. Phys. Lett. 51 (3), Jul. 20, 1987, p. 149-151.

Pei et al., "Optical and electrical properties of direct-current magnetron sputtered ZnO:Al films", Journal of Applied Physics, vol. 90, No. 7, Oct. 1, 2001, p. 3432-3436.

Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).

Cao et al., "Low resistivity p-ZnO films fabricated by sol-gel spin coating", Applied Physics Letters, 88, 251116 (Jun. 2006).

Zhao et al., "Growth of nitrogen-doped p-type ZnO films by spray pyrolysis and their electrical and optical properties", Journal of Crystal Growth, 280 (May 2005), 495-501.

Ye et al., "High mobility amorphous zinc oxynitride semiconductor material for thin film transistors", Journal of Applied Physics, 106, 074512 (2009).

Chiang et al., "High mobility transparent thin-film transistors with amorphous zinc tin oxide channel layer", Appl. Phys. Lett., 86, 013503 (2005).

Fortunato et al., "Wide-bandgap high-mobility ZnO thin-film transistors produced at room temperature", Applied Physics Letters, vol. 85, No. 13, 2541-2543.

Jackson et al., "High-performance flexible zinc tin oxide field-effect transistors", Applied Physics Letters, 87, 193503 (2005).

* cited by examiner

INTEGRATED PROCESS SYSTEM AND PROCESS SEQUENCE FOR PRODUCTION OF THIN FILM TRANSISTOR ARRAYS USING DOPED OR COMPOUNDED METAL OXIDE SEMICONDUCTOR

CROSS-REFERENCE TO RELATED APPLICATIONS

This application claims benefit of U.S. provisional patent application Ser. No. 61/038,999, filed Mar. 24, 2008, which is herein incorporated by reference.

BACKGROUND OF THE INVENTION

1. Field of the Invention

Embodiments of the present invention generally relate to an integrated processing system that may be used for thin film transistor (TFT) fabrication.

2. Description of the Related Art

Current interest in TFT arrays is particularly high because these devices may be used in liquid crystal active matrix displays of the kind often employed for computer and television flat panels. The liquid crystal active matrix displays may also contain light emitting diodes for back lighting. Further, organic light emitting diodes (OLEDs) have been used for active matrix displays, and these OLEDs may utilize TFTs for addressing the activity of the displays.

The TFT arrays may be created on a flat substrate. The substrate may be a semiconductor substrate, or may be a transparent substrate such as glass, quartz, sapphire, a clear plastic film, or a sheet or metal. A gate dielectric layer overlies a gate electrode, and semiconductor active areas overlie the gate dielectric layer. A passivation dielectric overlies the upper surface of the semiconductor areas and source and drain electrodes, to electrically isolate the semiconductor and electrodes from the ambient surrounding the upper surface of the TFT device. The above described TFT is a bottom gate TFT structure. Top gate TFT structures comprise source and drain electrodes and the semiconductor layer beneath the gate dielectric layer and the gate electrode in terms of process sequencing.

Performing multiple processes on a substrate to fabricate the TFT may necessitate utilizing multiple processing chambers. There is a need in the art for a processing system capable of TFT fabrication utilizing multiple processing chambers based on the need of the process and TFT device performance.

SUMMARY OF THE INVENTION

The present invention generally relates to an integrated processing system and process sequence that may be used for TFT fabrication. In fabricating TFTs, numerous processes may be performed on a substrate to ultimately produce the desired TFT. These processes may be performed in numerous processing chambers that may be coupled to a common transfer chamber. The arrangement of the processing chambers and the sequence in which the substrate may pass through the processing chambers may affect the device performance. By placing specific processing chambers around a common transfer chamber, multiple processes may be performed without undue exposure of the TFT to atmosphere. Alternatively, by passing the substrate sequentially through specific processing chambers, multiple processes may be performed without undue exposure of the TFT to atmosphere.

In one embodiment, a thin film transistor fabrication method is disclosed. The method may comprise disposing a first substrate into a first processing chamber. The first substrate may have a gate electrode disposed thereon. The method may also comprise depositing a gate dielectric layer over the first substrate and withdrawing the first substrate from the first processing chamber into a transfer chamber coupled thereto. The method may also comprise disposing the first substrate into a second processing chamber coupled with the transfer chamber and depositing a semiconductor layer over the gate dielectric layer. The semiconductor layer may comprise oxygen, nitrogen, and one or more elements selected from the group consisting of zinc, tin, gallium, cadmium, and indium. The method may also comprise withdrawing the first substrate from the second processing chamber into the transfer chamber and disposing the first substrate into a third processing chamber coupled with the transfer chamber. The method may additionally comprise depositing an etch stop layer on the semiconductor layer. After depositing the semiconductor layer, the substrate may be disposed into a heating chamber for thermal annealing. In one embodiment, the substrate may be disposed into a plasma chamber for plasma treating the semiconductor layer under user defined temperatures. In one embodiment, the heating and/or plasma treatment may occur after the gate dielectric layer has been deposited or after the etch stop layer has been deposited.

In another embodiment, thin film transistor fabrication method is disclosed. The method may comprise disposing a first substrate into a first processing chamber. The first substrate may have a gate electrode disposed thereon. The method may also comprise depositing a gate dielectric layer over the first substrate and withdrawing the first substrate from the first processing chamber into a transfer chamber coupled thereto. The method may also comprise disposing the first substrate into a second processing chamber coupled with the transfer chamber and depositing a semiconductor layer over the gate dielectric layer. The semiconductor layer may comprise oxygen, nitrogen, and one or more elements selected from the group consisting of zinc, tin, gallium, cadmium, and indium. The method may also comprise withdrawing the first substrate from the second processing chamber into the transfer chamber and disposing the first substrate into a third processing chamber coupled with the transfer chamber. The method may additionally comprise depositing a conductive layer over the semiconductor layer. After depositing the semiconductor layer, the substrate may be disposed into a heating chamber for thermal annealing. In one embodiment, the substrate may be disposed into a plasma chamber for plasma treating the semiconductor layer under user defined temperatures. In one embodiment, the heating and/or plasma treatment may occur after the gate dielectric layer has been deposited.

In another embodiment, a thin film transistor fabrication method is disclosed. The method may comprise disposing a substrate into a first processing chamber. The substrate may have a patterned semiconductor areas and a conductive layer disposed thereover with patterned photoresist on top of the conductive layer. The semiconductor layer may comprise oxygen, nitrogen, and one or more elements selected from the group consisting of zinc, indium, gallium, tin, and cadmium. The method may also comprise etching the conductive layer to expose at least a portion of the semiconductor layer, the etching defining a source electrode and drain electrode. The method may also comprise removing the photoresist after the etching process. The method may also comprise withdrawing the substrate from the first processing chamber into a transfer chamber coupled with the first processing chamber and disposing the substrate into a second processing chamber coupled with the transfer chamber. The method may also comprise depositing a passivation layer over the patterned semiconductor active areas and source-drain electrodes. Annealing or plasma treatment may take place after the etch, after the photoresist removal, or after the passivation layer deposition.

In another embodiment, a thin film transistor fabrication method is disclosed. The method may comprise disposing a substrate into a first processing chamber. The substrate may have a semiconductor layer and a conductive layer disposed thereover with patterned photoresist on top of the conductive layer. The semiconductor layer may comprise oxygen, nitrogen, and one or more elements selected from the group consisting of zinc, indium, gallium, tin, and cadmium. The method may also comprise etching the conductive layer to expose at least a portion of the semiconductor layer, etching the semiconductor layer to define the semiconductor active area, etching source and drain electrodes, and removing the photoresist after the etching. The method may also comprise withdrawing the substrate from the first processing chamber into a transfer chamber coupled with the first processing chamber and disposing the substrate into a second processing chamber coupled with the transfer chamber. The method may also comprise etching the semiconductor layer and depositing a passivation layer over the source electrode, drain electrode, and semiconductor active area. Annealing and/or plasma treatment processes may occur after the etching, after the photoresist removal, and/or after the passivation layer deposition.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to an integrated processing system and process sequence that may be used for TFT fabrication. In fabricating TFTs, numerous processes may be performed on a substrate to ultimately produce the desired TFT. These processes may be performed in numerous processing chambers that may be coupled to a common transfer chamber. The arrangement of the processing chambers and the sequence in which the substrate may pass through the processing chambers may affect the device performance. By placing specific processing chambers around a common transfer chamber, multiple processes may be performed without undue exposure of the TFT to atmosphere. Alternatively, by passing the substrate sequentially through specific processing chambers, multiple processes may be performed without undue exposure of the TFT to atmosphere.

Figure 1:
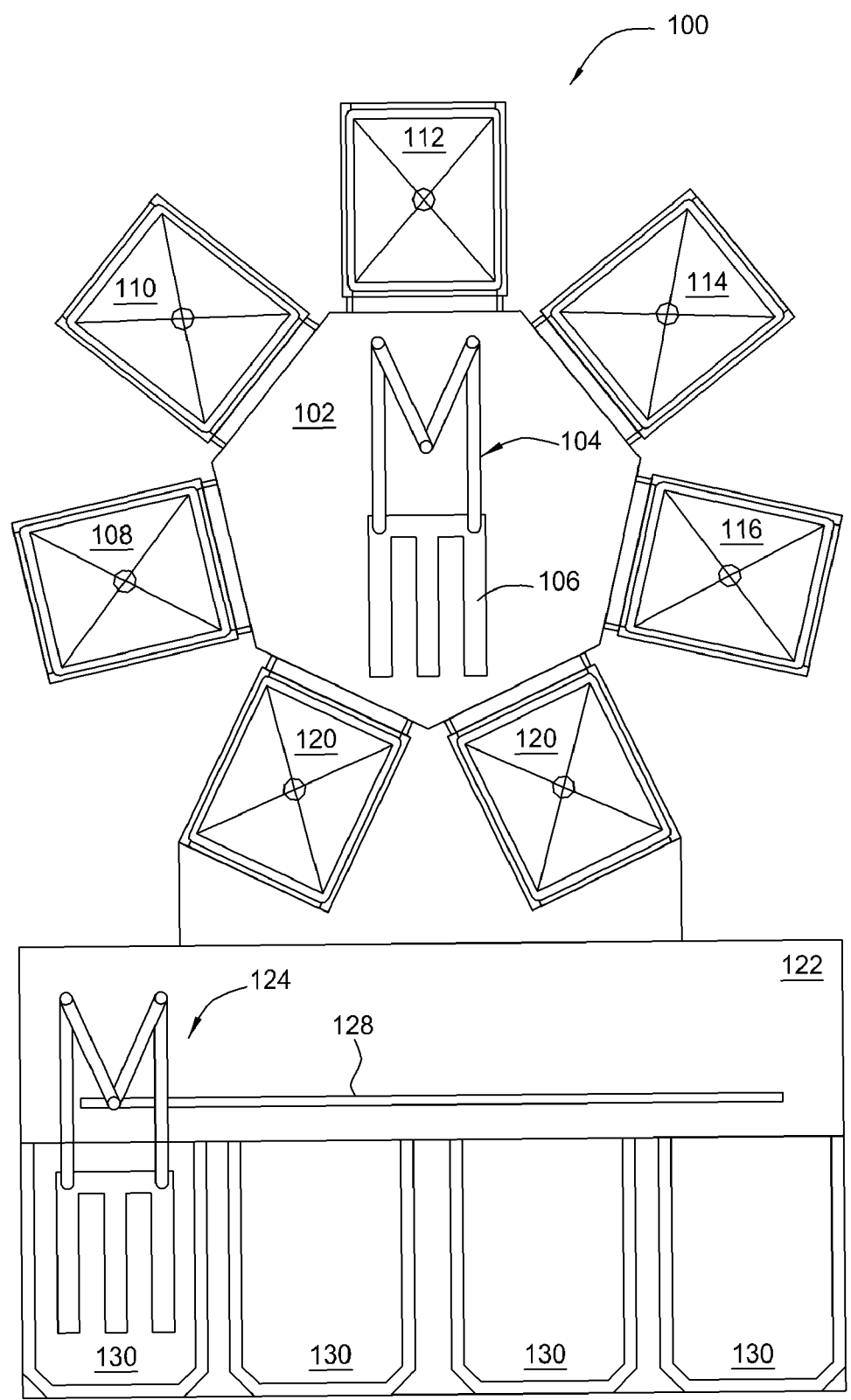
FIG. 1 is a schematic view of an integrated processing system 100 according to one embodiment.

FIG. 1 is a schematic view of an integrated processing system 100 according to one embodiment. The system 100 may comprise a transfer chamber 102 that has a robot 104 for transferring one or more substrates from a load lock 120 into the transfer chamber 102. The robot 104 may have an end effector 106 for transferring one or more substrates thereon. The robot 104 may extend into the load lock 120 to retrieve the substrates. The robot 104 may rotate about an axis and extend into one or more chambers 108, 110, 112, 114, 116 to place substrates into the chambers 108, 110, 112, 114, 116 or retrieve the substrates from the chambers 108, 110, 112, 114, 116.

The substrates may be delivered to the system 100 through one or more Front Opening Unified Pods (FOUPs) 130 that are coupled with a factory interface 122. Within the factory interface 122, one or more robots 124 may be present. The robots 124 have an end effector 126 for transferring substrates. The robot 124 may extend into the FOUPs 130 to retrieve substrates therefrom and to place substrates therein. The robot 104 may move within the factory interface 122 along a track 128 to permit the robot 124 to access each FOUP 130.

The robot 124 in the factory interface 122 may transfer a substrate from the FOUP 130 through the factory interface 122 and into a load lock 120. Alternatively, the robot 124 in the factory interface 122 may transfer a substrate from a load lock 120 through the factory interface 122 and into a FOUP 130.

Once the substrate is in the load lock 120, the robot 104 in the transfer chamber 102 may retrieve the substrate and transfer the substrate to any of the processing chambers 108, 110, 112, 114, 116. Additionally, the robot 104 in the transfer chamber 102 may transfer the substrate between any of the processing chambers 108, 110, 112, 114, 116. To fabricate TFTs, various processing chambers may be utilized such as a chemical vapor deposition (CVD) chamber, an annealing chamber, a physical vapor deposition (PVD) chamber, a dry etching chamber, or a treatment chamber.

Figure 2A:
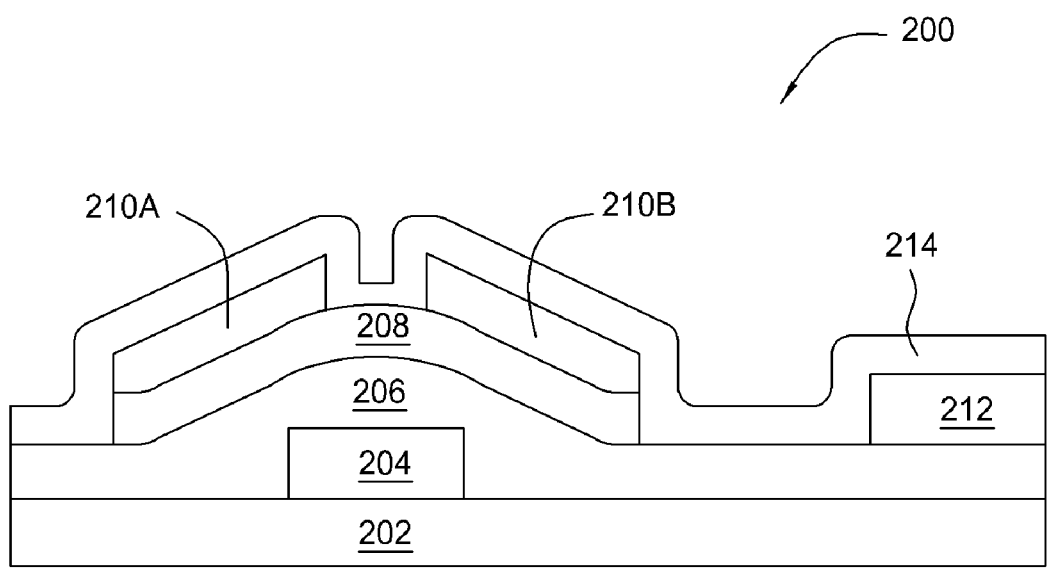
FIG. 2A is a schematic cross-sectional view of a TFT 200 that may be fabricated according to one embodiment of the invention.

FIG. 2A is a schematic cross-sectional view of a TFT 200 that may be fabricated according to one embodiment of the invention. The TFT 200 comprises a substrate 202. In one embodiment, the substrate 202 may comprise glass. In another embodiment, the substrate 202 may comprise a polymer. In another embodiment, the substrate 202 may comprise plastic. In another embodiment, the substrate 202 may comprise metal.

Over the substrate 202, a gate electrode layer may be deposited. The gate electrode layer may be patterned to form the gate electrode 204. The gate electrode 204 may comprise an electrically conductive material that controls the movement of charge carriers within the TFT 200. The gate electrode 204 may comprise a metal such as aluminum, tungsten, chromium, molybdenum, tantalum, or combinations thereof. The gate electrode 204 may be formed using conventional techniques including sputtering, lithography, and etching. For example, the gate electrode layer may be deposited by a well known deposition process such as sputtering, chemical vapor deposition (CVD), atomic layer deposition (ALD), etc. Thereafter, a photoresist layer may be deposited thereon, exposed, and developed to form a mask. Then, the gate electrode layer may be etched using the mask to form the gate electrode 204. The mask may then be removed.

A gate dielectric layer 206 may be deposited over the gate electrode 204. The gate dielectric layer 206 may comprise silicon dioxide, silicon oxynitride, silicon nitride, or combinations thereof. The gate dielectric layer 206 may be deposited by well known deposition techniques including plasma enhanced chemical vapor deposition (PECVD).

Over the gate dielectric layer 206, the active layer 208 may be formed. In one embodiment, the active layer 208 is annealed. In another embodiment, the active layer 208 is exposed to a plasma treatment. The annealing and/or plasma treatment may increase the mobility of the active layer 208. The active layer 208 may comprise the compound having one or more elements selected from the group consisting of zinc, tin, gallium, cadmium, and indium. In one embodiment, the element may comprise an element having a filled d orbital. In another embodiment, the element may comprise an element having a filled f orbital. The active layer 208 may also comprise oxygen and nitrogen. In one embodiment, the compound may be doped. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In one embodiment, the active layer 208 may comprise oxygen and one or more elements selected from the group consisting of zinc, tin, gallium, cadmium, and indium.

The active layer 208 may be deposited by reactive sputtering. The reactive sputtering method may be practiced in a physical vapor deposition (PVD) chamber for processing large area substrates, such as a 4300 PVD chamber, available from AKT America, Inc., a subsidiary of Applied Materials, Inc., Santa Clara, Calif. However, because the active layer produced according to the method may be determined by the structure and composition, it should be understood that the reactive sputtering method may have utility in other system configurations, including those systems configured to process large area round substrates and those systems produced by other manufacturers, including roll-to-roll process platforms. It is to be understood that other methods including CVD, ALD, or spin-on processes may be utilized to deposit the active layer 208. When deposited by sputtering, for example, the sputtering target may comprise the metal of the active layer 208. Then, a nitrogen containing gas and an oxygen containing gas may be introduced into the processing chamber to react with the sputtered metal and deposit on the gate dielectric layer 206 as the active layer 208. Examples of suitable nitrogen containing gases include $N_2$, $N_2O$, and combinations thereof.

Once the active layer 208 has been deposited, a conductive metal layer may be deposited and patterned to form a source electrode 210A and a drain electrode 210A. In one embodiment, the active layer 208 may be patterned along with the source electrode 210A and drain electrode 210B. In one embodiment, the conductive metal layer may comprise a metal such as aluminum, tungsten, molybdenum, chromium, tantalum, and combinations thereof.

A display electrode 212 may then be deposited over the gate dielectric layer 206. The display electrode 212 may comprise a metal such as aluminum, tungsten, molybdenum, chromium, tantalum, and combinations thereof. A passivation layer 214 may then be deposited over the TFT 200. The passivation layer 214 may be deposited to a thickness between about 1000 Angstroms to about 5000 Angstroms. In one embodiment, the passivation layer 214 may comprise silicon oxide or silicon nitride.

Figure 2B:
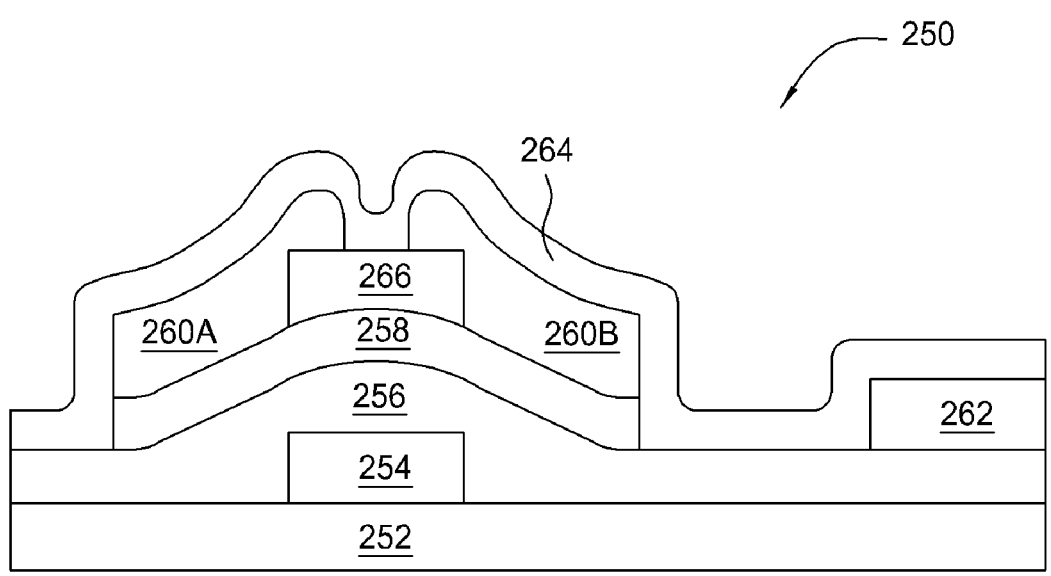
FIG. 2B is a schematic cross-sectional view of a TFT 250 that may be fabricated according to another embodiment of the invention.

FIG. 2B is a schematic cross-sectional view of a TFT 250 that may be fabricated according to another embodiment of the invention. The TFT 250 is similar to TFT 200 shown in FIG. 2A. The TFT 250 comprises a substrate 252, gate electrode 254, gate dielectric 256, active layer 258, source electrode 260A, drain electrode 260B, display electrode 262, and passivation layer 264. However, over the active layer 258, an etch stop 266 is deposited and patterned prior to deposition and patterning of the source electrode 260A and drain electrode 260B.

The etch stop 266 may be formed by blanket depositing followed by photoresist depositing, followed by pattern developing. In one embodiment, the etch stop 266 may be deposited by well known deposition techniques including plasma enhanced chemical vapor deposition (PECVD) and spin-on coating. The etch stop 266 may be patterned by plasma etching using one or more gases selected from the group consisting of fluorine such as $CF_4$, $C_2F_6$, $CHF_3$, $C_4F_6$, oxygen, nitrogen, inert gases such as Ar, or combinations thereof. In one embodiment, the etch stop layer 266 may comprise silicon nitride. In another embodiment, the etch stop layer 266 may comprise silicon oxynitride. In still another embodiment, the etch stop layer 266 may comprise silicon oxide. In one embodiment, the etch stop 266 may be pattern deposited utilizing a mask.

Following fabrication of the etch stop 266, a metal layer may be deposited thereover. The metal layer may then be patterned to define the source and drain electrodes 260A, 260B. The metal layer may be patterned by depositing a photolithographic mask thereon and etching utilizing the mask. The metal layer may be etched utilizing a plasma etch. In one embodiment, the plasma etching may comprise exposing the metal layer to a plasma containing a gas having an element selected from the group consisting of chlorine, oxygen, fluorine, or combinations thereof. During the etching, the active layer 258 that is not covered by the etch stop 266 may be exposed to the plasma, but the active layer 258 over the gate electrode 254 may not be exposed to the plasma due to the presence of the etch stop 266. The active layer 258 exposed to the plasma may etch at a slower rate than the metal layer when exposed to the plasma. In one embodiment, the active layer 258 may not etch at all when exposed to the plasma.

After the plasma etching, the etch stop 266 and the source and drain electrodes 260A, 260B may be used as a mask during wet or dry etching of the active layer 258. The etch stop 266 and the source and drain electrodes 260A, 260B etch at a slower rate than the active layer 258 when exposed to the wet etchant. In one embodiment, the etch stop 266 and the source and drain electrodes 260A, 260B may not etch at all when exposed to the wet etchant. Hence, no additional mask layer needs to be deposited and patterned to perform the etching. The source and drain electrodes 260A, 260B as well as the etch stop 266 function as a mask when etching the exposed active layer 258. The wet etchant may comprise any conventional wet etchant that may etch the effective for etching the active layer 258 without etching the etch stop 266 and the source and drain electrodes 260A, 260B. The etchant could be an acid with pH less than 3 or base with pH higher than 10. For example, diluted HCl or liquid used for photoresist development.

Figure 3:
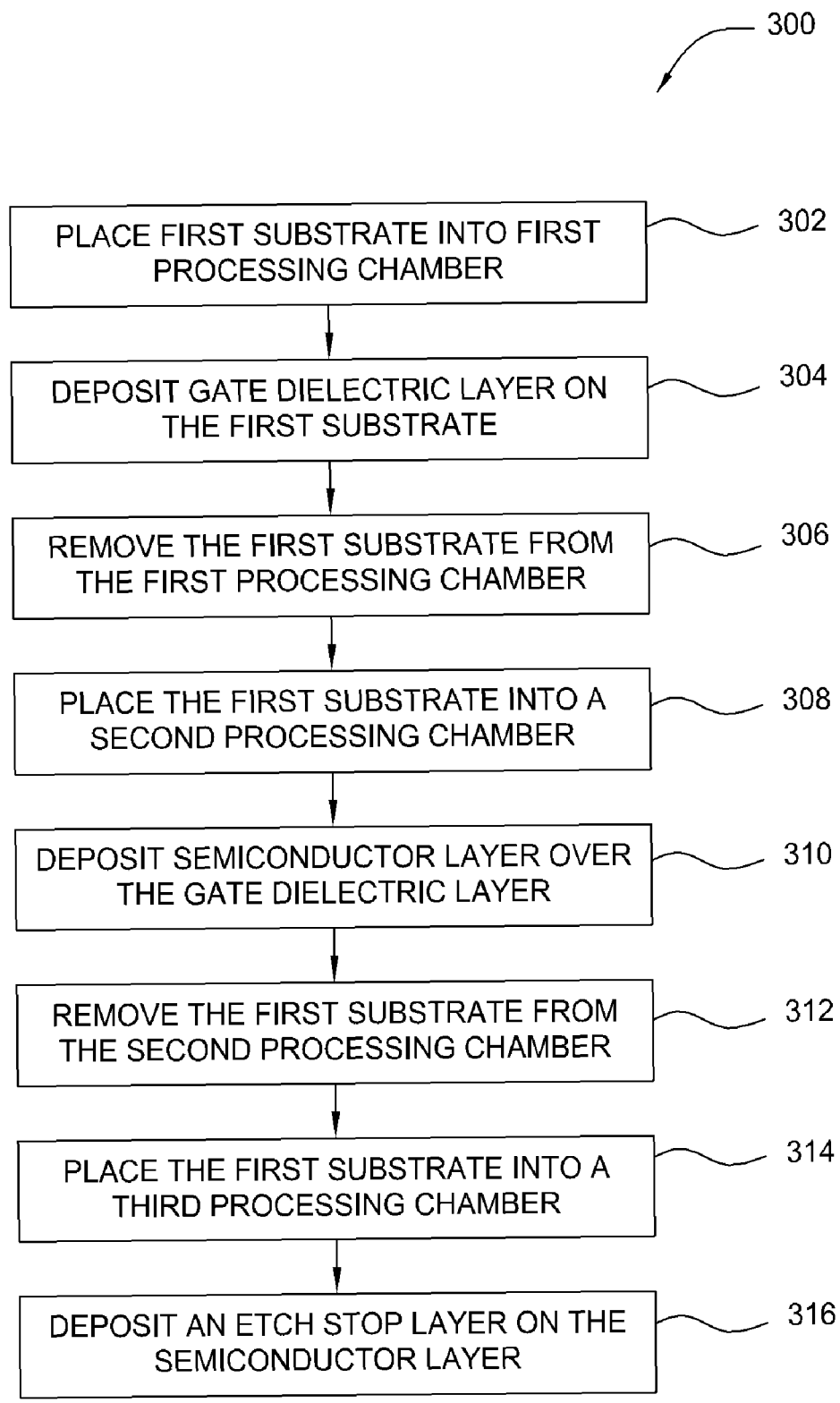
FIG. 3 is a flow chart 300 of a processing sequence for fabrication of a TFT according to one embodiment of the invention.

FIG. 3 is a flow chart 300 of a processing sequence for fabrication of a TFT according to one embodiment of the invention. A substrate having a gate electrode formed thereon is taken from a FOUP, passed through a factory interface by a robot and then inserted into a load lock chamber. A robot located in a transfer chamber retrieves the substrate from the load lock chamber and places the substrate into a first processing chamber (Step 302). In one embodiment, the first processing chamber may comprise a CVD processing chamber.

The transfer chamber may remain under vacuum during the process. The transfer chamber vacuum level may be adjusted to match the vacuum level of the processing chamber. For example, when transferring a substrate from a transfer chamber into a CVD chamber (or vice versa), the transfer chamber and CVD chamber may be maintained at the same vacuum level. Then, when transferring a substrate from the transfer chamber to a PVD chamber (or vice versa), the transfer chamber vacuum level may match the vacuum level of the PVD chamber even through the vacuum level of the PVD chamber and the CVD chamber may be different. Thus, the vacuum level of the transfer chamber may be adjusted.

Within the CVD processing chamber, a gate dielectric layer may be deposited on the substrate over both the substrate and the gate electrode (Step 304). The substrate having a gate electrode and gate dielectric layer thereover may then be removed from the CVD processing chamber (Step 306). The vacuum level of the transfer chamber may be adjusted to meet the vacuum level of the second processing chamber. Once the vacuum levels are substantially identical, the substrate having a gate electrode and gate dielectric layer thereon may be inserted into a second processing chamber (Step 308).

The second processing chamber may deposit a semiconductor (or active) layer over the gate dielectric layer (Step 310). In one embodiment, the semiconductor layer may be deposited by reactive sputtering in a PVD chamber. Thus, both a CVD processing chamber and a PVD processing chamber may be directly coupled to a common transfer chamber.

After the semiconductor layer is deposited on the substrate over the gate dielectric layer, the substrate may be removed from the PVD processing chamber (Step 312). The transfer chamber vacuum level may then be adjusted to substantially match the vacuum level of the third processing chamber. Once the vacuum level of the transfer chamber and the third processing chamber are substantially identical, the substrate may be placed into the third processing chamber (Step 314).

In the third processing chamber, an etch stop layer may be deposited (Step 316). The etch stop layer may be deposited by CVD. More processing chambers may be attached to the common transfer chamber for additional processes to be performed on the substrate. Alternatively, to ensure a maximum substrate throughput, additional CVD chambers for gate dielectric deposition, additional PVD chambers for semiconductor layer deposition, and/or additional CVD chambers for etch stop layer deposition may be attached to the common transfer chamber.

Following deposition of the etch stop layer, the substrate may be removed from the CVD processing chamber into the transfer chamber. The substrate may then be passed through a load lock into a factory interface and finally into a FOUP where the substrate may remain until further processing. Thus, a gate dielectric layer, a semiconductor layer, and an etch stop layer may be deposited over a substrate having a gate electrode formed thereon without breaking vacuum.

After depositing the semiconductor layer, the substrate may be disposed into a heating chamber for thermal annealing. In one embodiment, the substrate may be disposed into a plasma chamber for plasma treating the semiconductor layer under user defined temperatures. In one embodiment, the heating and/or plasma treatment may occur after the gate dielectric layer has been deposited or after the etch stop layer has been deposited.

Figure 4:
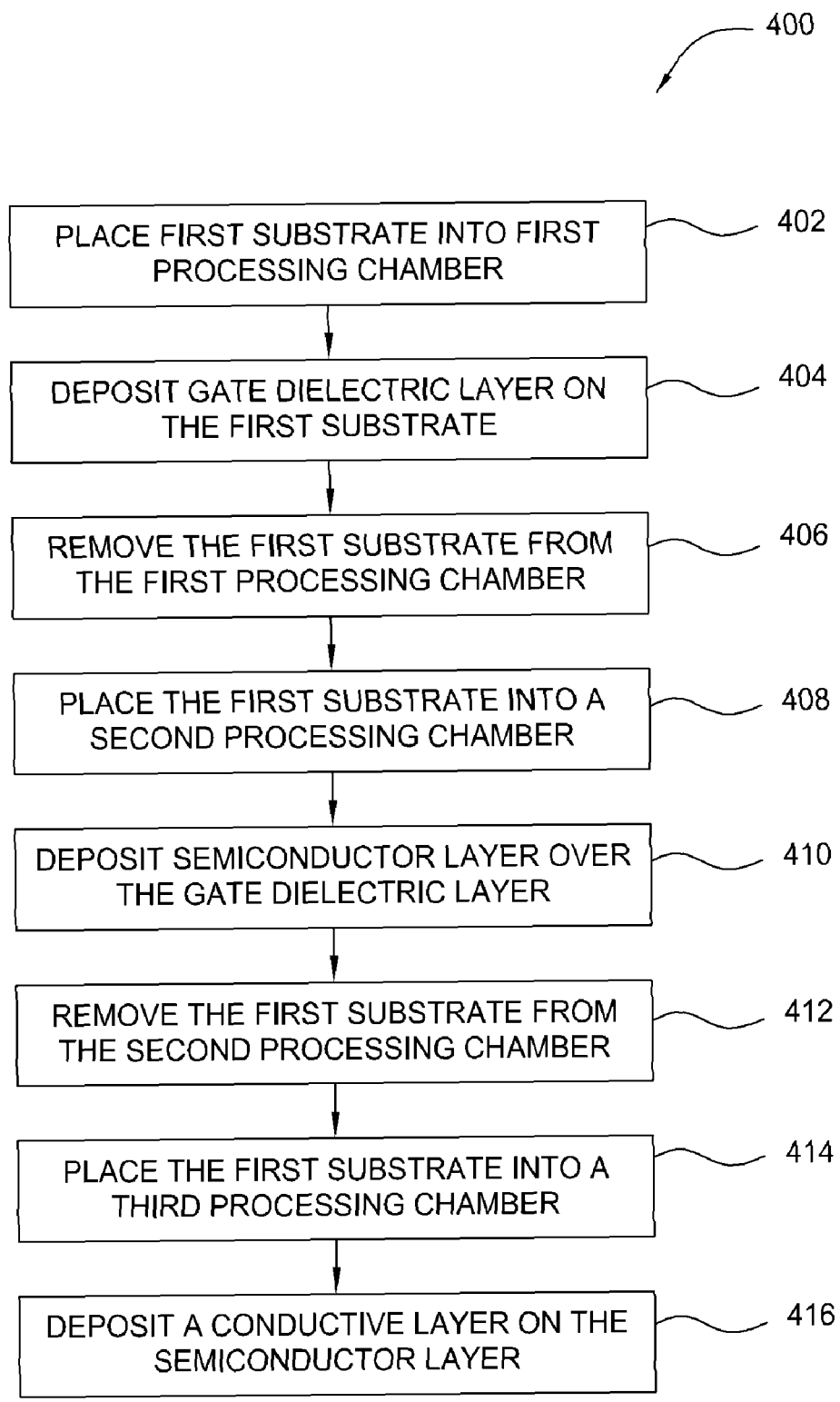
FIG. 4 is a flow chart 400 of a processing sequence for fabrication of a TFT according to another embodiment of the invention.

FIG. 4 is a flow chart 400 of a processing sequence for fabrication of a TFT according to another embodiment of the invention. A substrate having a gate electrode formed thereon is taken from a FOUP, passed through a factory interface by a robot and then inserted into a load lock chamber. A robot located in a transfer chamber retrieves the substrate from the load lock chamber and places the substrate into a first processing chamber (Step 402). In one embodiment, the first processing chamber may comprise a CVD processing chamber.

Similar to the embodiment discussed above in relation to FIG. 3, the transfer chamber may remain under vacuum during the process. The transfer chamber vacuum level may be adjusted to match the vacuum level of the processing chamber. For example, when transferring a substrate from a transfer chamber into a CVD chamber (or vice versa), the transfer chamber and CVD chamber may be maintained at the same vacuum level. Then, when transferring a substrate from the transfer chamber to a PVD chamber (or vice versa), the transfer chamber vacuum level may match the vacuum level of the PVD chamber even through the vacuum level of the PVD chamber and the CVD chamber may be different. Thus, the vacuum level of the transfer chamber may be adjusted.

Within the CVD processing chamber, a gate dielectric layer may be deposited on the substrate over both the substrate and the gate electrode (Step 404). The substrate having a gate electrode and gate dielectric layer thereover may then be removed from the CVD processing chamber (Step 406). The vacuum level of the transfer chamber may be adjusted to meet the vacuum level of the second processing chamber. Once the vacuum levels are substantially identical, the substrate having a gate electrode and gate dielectric layer thereon may be inserted into a second processing chamber (Step 408).

The second processing chamber may deposit a semiconductor (or active) layer over the gate dielectric layer (Step 410). In one embodiment, the semiconductor layer may be deposited by reactive sputtering in a PVD chamber. Thus, both a CVD processing chamber and a PVD processing chamber may be directly coupled to a common transfer chamber.

After the semiconductor layer is deposited on the substrate over the gate dielectric layer, the substrate may be removed from the PVD processing chamber (Step 412). The transfer chamber vacuum level may then be adjusted to substantially match the vacuum level of the third processing chamber. Once the vacuum level of the transfer chamber and the third processing chamber are substantially identical, the substrate may be placed into the third processing chamber (Step 414).

In the third processing chamber, a conductive metal layer may be deposited directly on the semiconductor layer (Step 416). The conductive metal layer may eventually be patterned to form source and drain electrodes. In one embodiment, the metal layer may be deposited by PVD. More processing chambers may be attached to the common transfer chamber for additional processes to be performed on the substrate. Alternatively, to ensure a maximum substrate throughput, additional CVD chambers for gate dielectric deposition, additional PVD chambers for semiconductor layer deposition, and/or additional PVD chambers for conductive metal layer deposition may be attached to the common transfer chamber.

Following deposition of the conductive metal layer, the substrate may be removed from the CVD processing chamber into the transfer chamber. The substrate may then be passed through a load lock into a factory interface and finally into a FOUP where the substrate may remain until further processing. Thus, a gate dielectric layer, a semiconductor layer, and a conductive metal layer may be deposited over a substrate having a gate electrode formed thereon without breaking vacuum.

After depositing the semiconductor layer, the substrate may be disposed into a heating chamber for thermal annealing. In one embodiment, the substrate may be disposed into a plasma chamber for plasma treating the semiconductor layer under user defined temperatures. In one embodiment, the heating and/or plasma treatment may occur after the gate dielectric layer has been deposited has been deposited.

Figure 5:
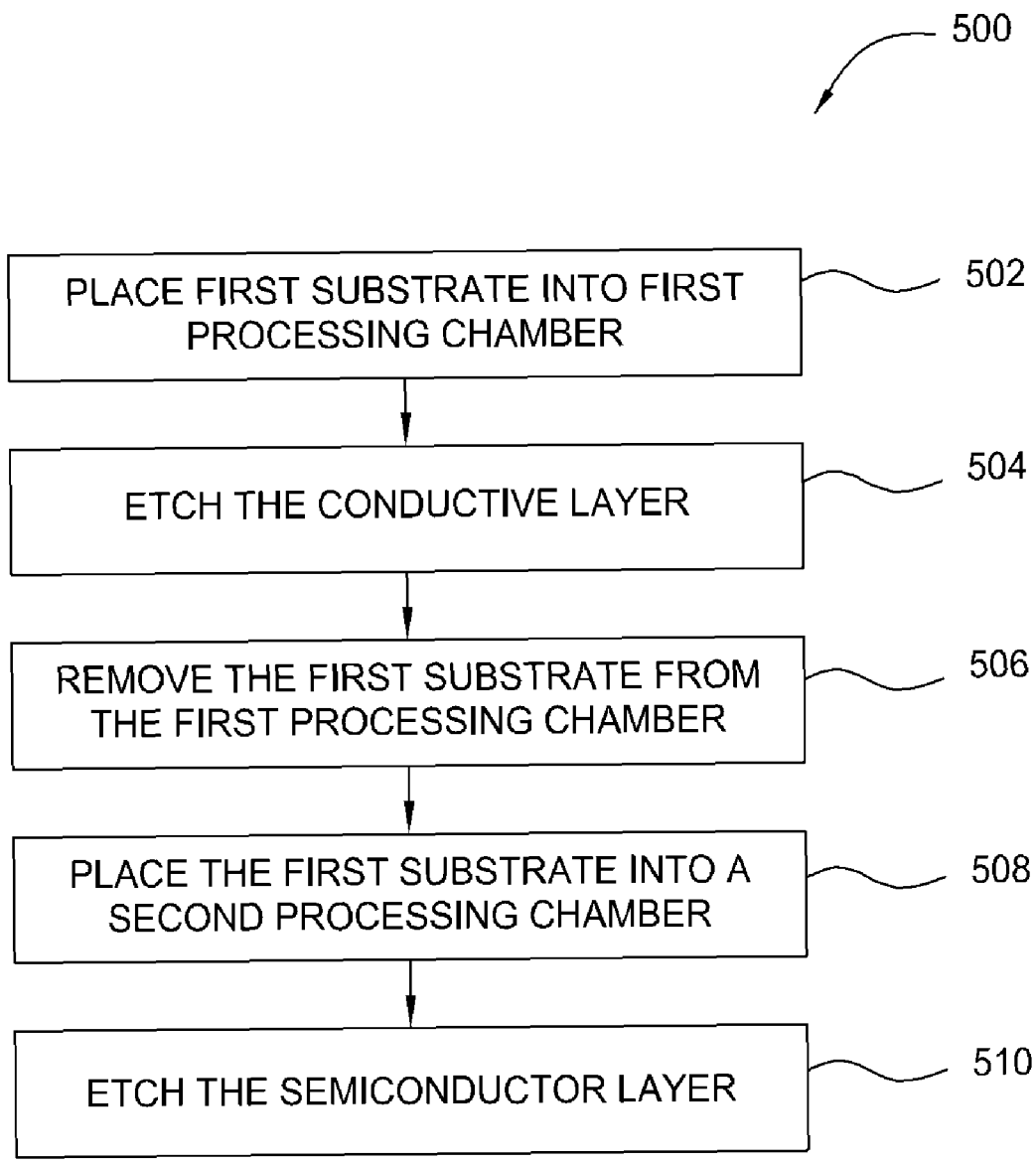
FIG. 5 is a flow chart 500 of a processing sequence for fabrication of a TFT according to another embodiment of the invention.

FIG. 5 is a flow chart 500 of a processing sequence for fabrication of a TFT according to another embodiment of the invention. A substrate having a gate electrode, gate dielectric layer, semiconductor layer, and conductive metal layer formed thereon is taken from a FOUP, passed through a factory interface by a robot and then inserted into a load lock chamber. A robot located in a transfer chamber retrieves the substrate from the load lock chamber and places the substrate into a first processing chamber (Step 502). The first processing chamber may be an etching chamber. The substrate may have a photoresist mask formed thereon. Alternatively, the substrate may be disposed into one or more chambers for photoresist deposition and patterning prior to insertion into the etching chamber.

The conductive metal layer may then be etched (Step 504) using the photoresist mask to pattern the conductive metal layer into source and drain electrodes. In one embodiment, the conductive metal layer is etched to form a display electrode on the gate dielectric layer. The substrate may then be removed from the etching chamber (Step 506). In one embodiment, the remaining photoresist may be removed in the etching chamber. In another embodiment, the substrate may be placed into another processing chamber to strip the photoresist mask from the substrate. The substrate may then be placed into a second processing chamber (Step 508). In the second processing chamber, the semiconductor layer may be etched using the source and drain electrodes as a mask (Step 510).

Alternatively, the semiconductor layer may have been previously etched. Therefore, after the source and drain electrodes are defined, a passivation layer may be deposited over the source and drain electrodes, the active layer, any exposed portion of the gate dielectric layer, and the display electrode.

The substrate may be disposed into a heating chamber for thermal annealing. In one embodiment, the substrate may be disposed into a plasma chamber for plasma treating the semiconductor layer under user defined temperatures. In one embodiment, the heating and/or plasma treatment may occur after the etching.

By coupling the necessary processing chambers to a common transfer chamber, multiple processing steps may be performed in a TFT fabrication process without breaking vacuum. Additionally, substrate throughput may be maximized by coupling additional processing chambers for slower processes to the transfer chamber so that the processing sequence may avoid bottlenecks in TFT processing.

While the foregoing is directed to embodiments of the present invention, other and further embodiments of the invention may be devised without departing from the basic scope thereof, and the scope thereof is determined by the claims that follow.

The invention claimed is:

1. A thin film transistor fabrication method, comprising:
    disposing a first substrate into a first processing chamber, the first substrate having a gate electrode disposed thereon;
    depositing a gate dielectric layer over the first substrate using a plasma enhanced chemical vapor deposition process;
    withdrawing the first substrate from the first processing chamber into a transfer chamber coupled thereto;
    disposing the first substrate into a second processing chamber coupled with the transfer chamber;
    depositing a semiconductor layer over the gate dielectric layer by a physical vapor deposition process, the physical vapor deposition process comprising reacting oxygen and nitrogen with one or more elements selected from the group consisting of zinc, tin, gallium, cadmium, and indium;
    withdrawing the first substrate from the second processing chamber into the transfer chamber;
    disposing the first substrate into a third processing chamber coupled with the transfer chamber; and
    depositing an etch stop layer on the semiconductor layer using a plasma enhanced chemical vapor deposition process.

2. The method of claim 1, wherein the etch stop layer is selected from the group consisting of silicon nitride, silicon oxide, and combinations thereof.

3. The method of claim 1, wherein the gate electrode is selected from the group consisting of chromium, molybdenum, aluminum, tungsten, tantalum, and combinations thereof.

4. The method of claim 1, wherein the physical vapor deposition comprises:
    applying a DC electrical bias to a sputtering target comprising one or more elements selected from the group consisting of zinc, indium, cadmium, gallium, and tin; and
    introducing a nitrogen containing gas and an oxygen containing gas into the second processing chamber.

5. The method of claim 4, wherein the sputtering target comprises a dopant selected from the group consisting of aluminum, tin, gallium, calcium, silicon, titanium, copper, germanium, indium, nickel, chromium, vanadium, magnesium, and combinations thereof.

6. The method of claim 5, further comprising:
    disposing a second substrate into a fourth processing chamber, the second substrate having a gate electrode disposed thereon;
    depositing a gate dielectric layer over the second substrate;
    withdrawing the second substrate from the fourth processing chamber into the transfer chamber coupled thereto;
    disposing the second substrate into a fifth processing chamber coupled with the transfer chamber;
    depositing a semiconductor layer over the gate dielectric layer, the semiconductor layer comprising oxygen, nitrogen, and one or more elements selected from the group consisting of zinc, tin, gallium, cadmium, and indium;

withdrawing the second substrate from the fifth processing chamber into the transfer chamber;
disposing the second substrate into the third processing chamber coupled with the transfer chamber; and
depositing an etch stop layer on the semiconductor layer.

7. The method of claim 1, wherein the method is performed without breaking vacuum.

8. The method of claim 1, further comprising:
disposing a second substrate into a fourth processing chamber, the second substrate having a gate electrode disposed thereon;
depositing a gate dielectric layer over the second substrate;
withdrawing the second substrate from the fourth processing chamber into the transfer chamber coupled thereto;
disposing the second substrate into a fifth processing chamber coupled with the transfer chamber;
depositing a semiconductor layer over the gate dielectric layer, the semiconductor layer comprising oxygen, nitrogen, and one or more elements selected from the group consisting of zinc, tin, gallium, cadmium, and indium;
withdrawing the second substrate from the fifth processing chamber into the transfer chamber;
disposing the second substrate into the third processing chamber coupled with the transfer chamber; and
depositing an etch stop layer on the semiconductor layer.

9. The method of claim 8, wherein the method is performed without breaking vacuum.

10. A thin film transistor fabrication method, comprising:
disposing a first substrate into a first processing chamber, the first substrate having a gate electrode disposed thereon;
depositing a gate dielectric layer over the first substrate;
withdrawing the first substrate from the first processing chamber into a transfer chamber coupled thereto;
disposing the first substrate into a second processing chamber coupled with the transfer chamber;
depositing a semiconductor layer over the gate dielectric layer by reacting oxygen and nitrogen with one or more elements selected from the group consisting of zinc, tin, gallium, cadmium, and indium;
withdrawing the first substrate from the second processing chamber into the transfer chamber;
disposing the first substrate into a third processing chamber coupled with the transfer chamber; and
depositing a conductive layer over the semiconductor layer.

11. The method of claim 10, wherein the conductive layer is deposited by physical vapor deposition and wherein the semiconductor layer is deposited by physical vapor deposition.

12. The method of claim 11, wherein the physical vapor deposition for the semiconductor layer comprises:
applying a DC electrical bias to a sputtering target comprising one or more elements selected from the group consisting of zinc, indium, cadmium, gallium, and tin; and
introducing a nitrogen containing gas and an oxygen containing gas into the second processing chamber.

13. The method of claim 12, wherein the sputtering target comprises a dopant selected from the group consisting of aluminum, tin, gallium, calcium, silicon, titanium, copper, germanium, indium, nickel, chromium, vanadium, magnesium, and combinations thereof.

14. The method of claim 10, wherein the method is performed without breaking vacuum.

15. The method of claim 10, wherein an etch stop layer is not deposited between the semiconductor layer and the conductive layer.

16. The method of claim 10, further comprising:
disposing a second substrate into a fourth processing chamber, the second substrate having a gate electrode disposed thereon;
depositing a gate dielectric layer over the second substrate;
withdrawing the second substrate from the fourth processing chamber into the transfer chamber coupled thereto;
disposing the second substrate into a fifth processing chamber coupled with the transfer chamber;
depositing a semiconductor layer over the gate dielectric layer, the semiconductor layer comprising oxygen, nitrogen, and one or more elements selected from the group consisting of zinc, tin, gallium, cadmium, and indium;
withdrawing the second substrate from the fifth processing chamber into the transfer chamber;
disposing the second substrate into the third processing chamber coupled with the transfer chamber; and
depositing a conductive layer over the semiconductor layer.

17. A thin film transistor fabrication method, comprising:
disposing a substrate into a first processing chamber, the substrate having a semiconductor layer and a conductive layer disposed thereover, the semiconductor layer is a reaction product of oxygen, nitrogen, and one or more elements selected from the group consisting of zinc, indium, gallium, tin, and cadmium;
etching the conductive layer to expose at least a portion of the semiconductor layer, the etching defining a source electrode and drain electrode;
withdrawing the substrate from the first processing chamber into a transfer chamber coupled with the first processing chamber;
disposing the substrate into a second processing chamber coupled with the transfer chamber; and
etching the semiconductor layer.

18. The method of claim 17, wherein etching the conductive layer comprises plasma etching and wherein etching the semiconductor layer comprises wet etching.

19. The method of claim 17, further comprising:
withdrawing the substrate from the second processing chamber into the transfer chamber;
disposing the substrate into a third processing chamber;
depositing a passivation layer over the source electrode, drain electrode, and semiconductor layer.

20. The method of claim 17, wherein no etch stop layer is present between the semiconductor layer and the conductive layer.

* * * * *

UNITED STATES PATENT AND TRADEMARK OFFICE
CERTIFICATE OF CORRECTION

Page 1 of 1

PATENT NO.       : 7,879,698 B2
APPLICATION NO.  : 12/405941
DATED            : February 1, 2011
INVENTOR(S)      : Ye It is certified that error appears in the above-identified patent and that said Letters Patent is hereby corrected as shown below:

On the Title Page
In the References Cited Item (56):

Please insert --Gordon, "Criteria for Choosing Transparent Conductors", MRS Bulletin, August 2000, pg. 52-57.--.

Signed and Sealed this
Nineteenth Day of April, 2011

David J. Kappos
*Director of the United States Patent and Trademark Office*